United States Patent [19]

Lischke

[11] Patent Number: 4,982,099
[45] Date of Patent: Jan. 1, 1991

[54] APERTURE DIAPHRAGM FOR A LITHOGRAPHY APPARATUS

[75] Inventor: Burkhard Lischke, Munich, Fed. Rep. of Germany

[73] Assignee: Siemens Aktiengesellschaft, Berlin and Munich, Fed. Rep. of Germany

[21] Appl. No.: 824,239

[22] Filed: Jan. 30, 1986

[30] Foreign Application Priority Data

Feb. 12, 1985 [DE] Fed. Rep. of Germany ....... 3504705

[51] Int. Cl.$^5$ ......................... H01J 37/04; H01J 37/30
[52] U.S. Cl. ........................... 250/492.2; 250/396 R; 250/398; 313/422; 313/432
[58] Field of Search ................ 250/492.2, 396 R, 398; 313/422, 432

[56] References Cited

U.S. PATENT DOCUMENTS 4,409,487 10/1983 Kuschel et al. ..................... 250/398
4,524,278 6/1985 LePoole ............................. 250/398
4,563,613 1/1986 Genovese et al. ................... 313/422

OTHER PUBLICATIONS

IEEE Transactions on Electronic Devices, vol. ED 26, No. 4, Apr. 1979, pp. 663-674, Recent Advances in Electron-Beam Lithography for the High-Volume Production of BLSIDevices by Hans C. Pfeiffer.

Primary Examiner—Jack I. Berman
Attorney, Agent, or Firm—Hill, Van Santen, Steadman & Simpson

[57] ABSTRACT

An aperture diaphragm for lithography apparatus which has a line-shaped multi-hole structure comprising blanking electrodes for generating a plurality of individually blankable particle beam probes for lithography apparatus comprising a particle beam source, a condenser lens, a blanking diaphragm and imaging optics and a workpiece to be structured such as a semiconductor body wherein a simple aperture diaphragm is composed of a high resistant substrate such as silicon or silicon dioxide upon which blanking electrodes are formed in the form of interconnects which are provided with terminals for applying blanking voltages.

5 Claims, 4 Drawing Sheets

APERTURE DIAPHRAGM FOR A LITHOGRAPHY APPARATUS

CROSS-REFERENCES TO RELATED APPLICATIONS

This application is related to U.S. Pat. No. 4,724,328 entitled "Lithographic Apparatus For The Production of Microstructures" assigned to the assignee of the present invention.

BACKGROUND OF THE INVENTION

1. Field of the Invention

This invention relates in general to an aperture diaphragm for lithography apparatus comprising a line-shaped multi-hole structure and blanking electrodes for generating a plurality of individually blankable particle beam probes.

2. Description of the Prior Art

An article in IEEE Transactions on Electron Devices, Volume ED-26, No. 4, April 1979, at pages 663 through 674 and particularly FIG. 4 discloses an aperture diagram of the prior art. In this article, the blanking electrodes are composed of pairs of plates which are mounted at the side edges of the recesses of the multi-hole structures and these plate pairs are charged with blanking voltages via coaxial lines so that the particle beam probes which pass through the recesses will be laterally deflected in the direction toward a blanking diaphragm by means of the electrostatic fields between the pairs of plates. Such aperture diaphragm however, comprises an extremely complicated structure and is very costly since the cost increases with the number of recesses and, thus, a structure for a large number of particle beam probes becomes very expensive.

SUMMARY OF THE INVENTION

It is an object of the present invention to provide an aperture diaphragm which can be designed for a multitude of particle beam probes which is inexpensive and simple to manufacture. This is achieved in that the aperture diaphragm is composed of a high resistance substrate such as silicon or silicon dioxide on which blanking electrodes are formed in the form of interconnects which are provided with terminals for the supplying of blanking voltages.

The advantages obtainable with the invention lies in the fact that both the recesses as well as the blanking electrodes which cooperate with them can be manufactured in a simple planar technique and the cost is not prohibitive even for a very large number of recesses so as to form a very large number of particle beam probes.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure and in which:

DESCRIPTION OF THE PREFERRED EMBODIMENTS

Figure 1:
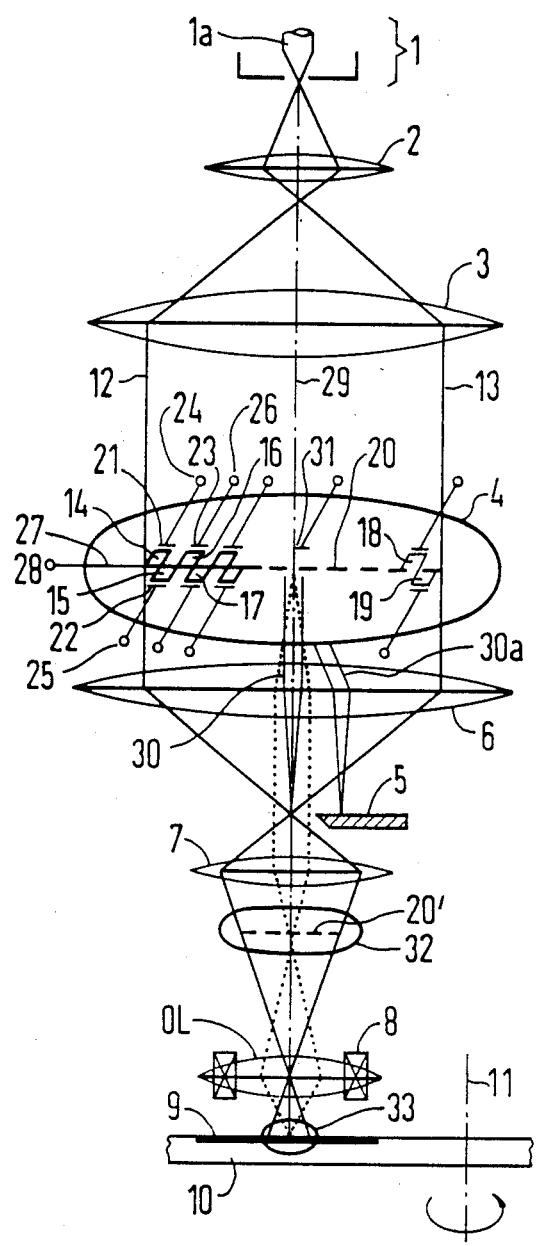
FIG. 1 is a schematic view of the lithography apparatus and illustrates a first embodiment of the aperture diaphragm of the invention.

FIG. 1 illustrates schematically a lithography apparatus which has an electron beam source 1 with a single crystal pin cathode 1a which supplies an electron beam to condenser lenses 2 and 3 and then to an aperture diaphragm 4. A blanking diaphragm 5 is mounted so as to intercept the beam from the aperture diaphragm and imaging optic lenses 6 and 7 and objective lens OL are mounted so as to intercept the beam. A deflection system 8 is mounted above a workpiece 9 which is to be formed and may be a semiconductor body, for example. The workpiece 9 is mounted on a mechanical support 10 which can be expediently mounted on a rotatable vertical axis 11.

The electrons emerging from the cathode 1a are combined into a beam by the condenser lens 2 and 3 and this beam is limited by the mutually parallel marginal rays 12 and 13. The aperture diaphragm 4 constructed in a wafer-like fashion is provided with a line-shaped multi-hole structure. Rectangular or quadratic recesses 14 through 19 are provided in the aperture diaphragm 4 and these respectively emanate from a central broken line 20 and are alternately offset toward a first and opposite side as illustrated. In detail, the recesses 14, 16...18 are on one side of line 20 and the recesses 15, 17,... 19 are on the other side of line 20. Blanking electrodes 21 through 23 are respectively formed adjacent the recesses on the side opposite the line 20 and the blanking electrodes 21 through 23 are provided with terminals 24 through 26. An additional electrode 27 extends along the line 20 and is a counter electrode which is shared by all of the recesses and it is connected to a terminal 28.

A plurality of electron beams probes are formed by the aperture diaphragm 4 from the electron beam which is limited by the marginal rays 12 and 13. Each of the electron beam probes is formed of a part of the electron beam which passes through one of the recesses 14 through 19. In FIG. 1, an electron beam probe which passes through a recess which is not shown in detail lying in the longitudinal axis 29 of the lithographic apparatus is indicated by numeral 30. When the blanking electrode 31 associated with this recess and the counter electrode 27 have a voltage applied to them such that the blanking electrode 31 is at a more positive potential than the counter electrode 27 then the beam probe 30 will be deflected into the position 30a where it will be intercepted by the blanking diaphragm 5 so that it is blanked out of the beam path. It should be noted that the deflection of the probe 30 actually occurs behind the plane of the drawing of FIG. 1 whereby the position of the deflected probe 30a should be imagined as being under the lens 6 parallel to the plane of the drawing of FIG. 1, but behind the plane of the drawing. Thus, the blanking diaphragm 5 must be situated behind the plane of the drawing of FIG. 1. It has been indicated for reasons of simplification in FIG. 1, that the deflection of probe 30 occurs toward the right and the blanking electrode 5 lies in the plane of the drawing of FIG. 1.

Every beam probe as, for example, probe 30 which is not deflected is available for exposing the surface of the workpiece 9 or a resist applied thereto. For blanking a beam probe formed according to FIG. 1 by, for example, the recess 14, the electrode 21 is supplied with a positive voltage and the electrode 27 is applied a reference potential. When a beam probe formed by the recess 15 is to be blanked, then the negative voltage is applied to the electrode 22. If the diaphragm 5 is formed as a slit which is situated on both sides before and behind the plane of the drawing of FIG. 1, a positive voltage can also be utilized on the electrode 22.

As illustrated, the probe cross-sections in the plane of the aperture diaphragm 4 which are established by the dimensions of the recesses, for example, the recess 14 are imaged demagnified in a plane 32 by the means of the lenses 6 and 7 and this corresponds to reduction of the line 20 shown on diaphragm 4 to a line 20' shown on plane 32. The objective lens OL images the cross-sections of the electron beam probes which have been demagnified onto the surface of the workpiece 9 and this is indicated by their impinging point 33.

Structures are formed on the workpiece or body 9 according to FIG. 1 such that all of the electron beam probes which are not blanked will be moved after the exposure of the points of the workpiece or body 9 or of a resist covering the workpiece and then the probes are moved by, for example, the deflection system 8 relative to the workpiece 9 in a direction roughly perpendicular to the projection of the line 20 and are moved by a dimension of the probe. Then the next probe line is exposed in a manner analogous to the first probe line. By individually driving the blanking electrodes such as electrode 21 an arbitrary exposure pattern can be generated on the surface of the workpiece 9 and the smallest structural detail corresponds to the cross-sectional dimension of a probe measured on the surface of the workpiece 9.

The dotted beam path in FIG. 1 illustrates the imaging of the recesses 14 or, respectively, of the aperture diaphragm 4 onto the surface of the workpiece or body 9.

Figure 2:
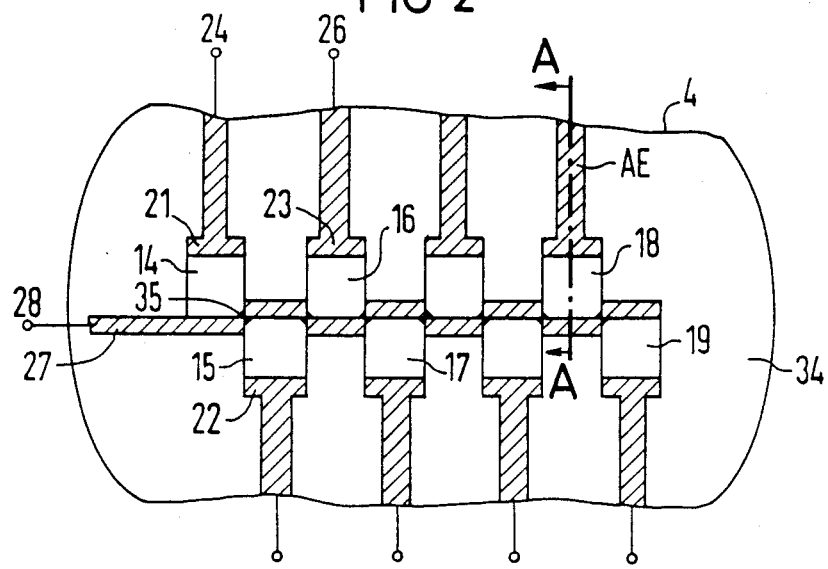
FIG. 2 is a plan view of the aperture diaphragm.

FIG. 2 illustrates an embodiment of the aperture diaphragm 4 which is schematically illustrated in FIG. 1. As illustrated in FIG. 2, a high resistant substrate film 34 of, for example, silicon is provided with recesses 14 through 19. Electrodes 21, 22 and 23 and so on for each of the recesses serve as beam blanking electrodes are formed as interconnects which have broadened ends and these electrodes may be formed of gold, for example. The common electrode 27 is composed of gold and procedes meander-like between the recesses and is provided with adequately broad webs 35 so as to achieve good contact between individual portions. The surface of diaphragm 4 facing the electron beam source is provided with a conductive coating layer outside of the hole structures and the incident electrons are diverted by way of this conductive coating. This conductive coating is separated from the interconnect by an insulating intermediate layer.

Figure 3:
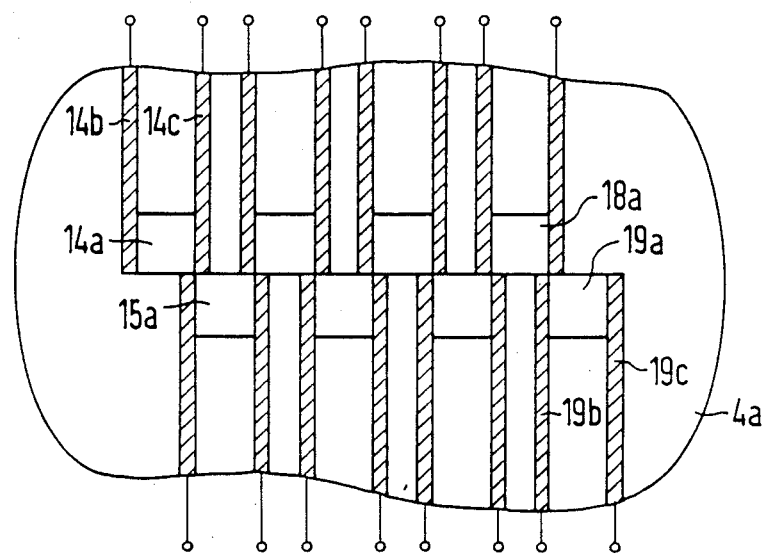
FIG. 3 illustrates an additional aperture diaphragm which can be utilized in the invention.

According to an advantageous development, the aperture diaphragm 4 can be augmented by a further aperture diaphragm 4a illustrated in FIG. 3. This is formed of a high resistant substrate film of, for example, silicon and comprises recesses 14a through 19a which assuming a precise mutual adjustment of the diaphragms 4 and 4a coincide with the recesses 14 through 19. Two electrodes are respectively provided at the edges of the recesses 14a through 19a and these are indicated as 14b, 14c through 19b and 19c and these electrodes are connected to suitable terminals as illustrated. Suitable voltage which cause a deflection of the electron beam probes parallel to the longitudinal direction of the line-shaped multi-hole structures can be applied to the terminal so as to correct optical errors such as, for example, spherical aberrations of the condenser lens, distortion of the imaging optics and so forth. The electrode structures of the diaphragm 4a are formed as interconnects and are formed, for example, of gold.

The aperture diaphragm 4 or 4a formed as described can be designed to have a very large number of recesses 17 with a particular advantage. For example, 2,048 recesses may be used and a corresponding number of electron beam probes are generated thereby. If a quadratic-shape of the recesses is utilized having a side length of 10 $\mu$m and when the probe dimension is demagnified by a factor of 100 using imaging optics, then individual exposable image points having a side length of 0.1 $\mu$m results. With a probe current of about 5 nA for each probe, an exposure rate of about 1 cm$^2$/s is achieved with a resist sensitivity of $C = 10^{-5}$ As/cm$^2$ and this corresponds to a throughput of about 50 4" semiconductor wafers per hour. The length of the multi-hole structure of the aperture diaphragm 4 therefore will be about 20.5 mm. With such an aperture diaphragm structures in the 0.1 $\mu$m range can be generated such as are required, for example, for integrated circuits on a GaAs base or for components of optical communication technology such as for example grating structures for solid state lasers.

Figure 4:
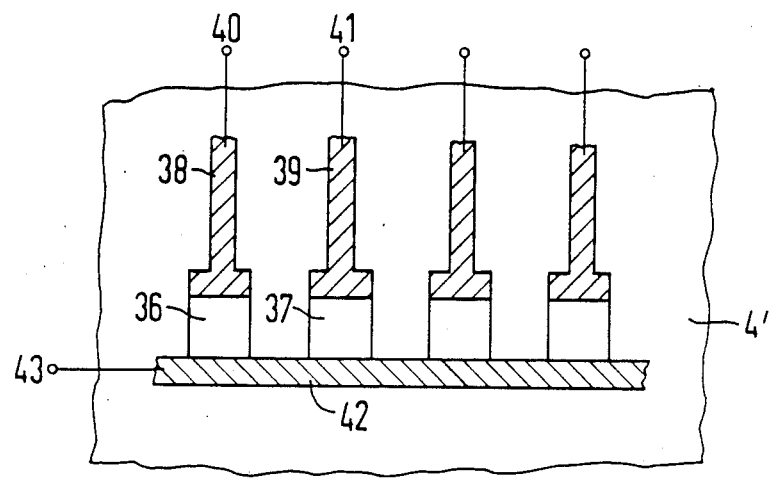
FIG. 4 discloses a second embodiment of the aperture diaphragm of the invention.

FIG. 4 illustrates another preferred embodiment of the invention wherein the aperture diaphragm 4' is formed of a high resistant substrate film of, for example, silicon and individual recesses 36, 37 . . . as contrasted to the embodiments illustrated in FIGS. 1 and 2 lie along the line without being offset relative to each other. The blanking electrodes in the embodiment of FIG. 4 are mounted at the edge relative to the individual recesses and are fashioned as interconnects 38, 39 . . . which are broadened at their ends and are provided with terminals 40, 41 . . . at their ends. The interconnects 38, 39 can be formed of gold. The common counter electrode 42 is formed as a separate interconnect which has a terminal 43 at its end. When positive voltages are applied to terminals 40 and so forth and when terminal 43 is connected to reference potential, then electron beam probes passing through the openings 36, 37 . . . can be blanked in the manner described above. Expediently, two respective neighboring recesses such as recesses 36 and 37 are spaced a distance from each other which corresponds to their dimension in the direction of the longitudinal axis of the multi-hole structure. After each and every individual exposure event in the exposure of the surface of the workpiece 9, a shift of the electron beam probes within the same line position of said electron beam probes must then occur by a dimension in the direction of the longitudinal axis of the multi-hole structure so that a complete exposure of the workpiece 9 is assured. This shift is advantageously undertaken by the deflection system 8.

Figure 5:
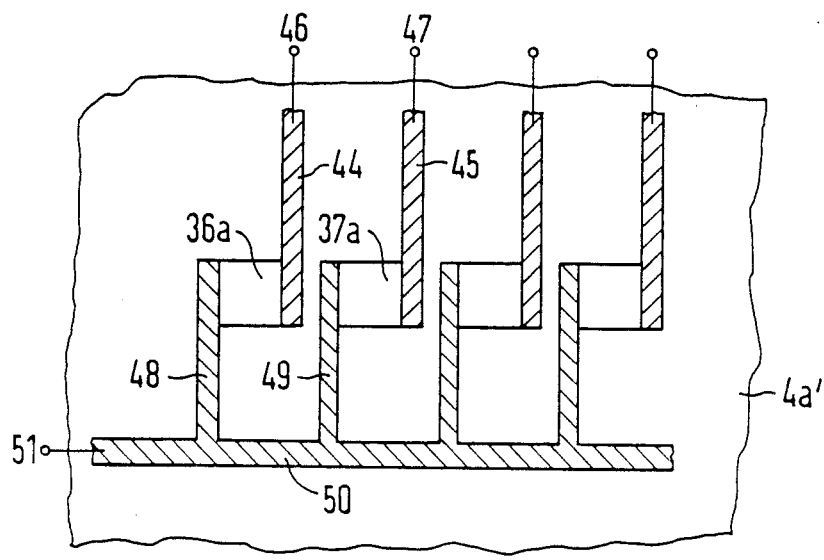
FIG. 5 illustrates an additional aperture diaphragm which can be utilized together with the aperture diaphragm of FIG. 4.

The aperture diaphragm 4' can be augmented by a further aperture diaphragm 4a' illustrated in FIG. 5. The recesses 36a, 37a . . . of the diaphragm 4a' are arranged such that given a precise mutual adjustment of the diaphragms 4' and 4a' they coincide with the recesses 36, 37 .... Additional blanking diaphragm terminals 44, 45 ... are provided at the edges relative to the recesses 36a, 37a ... then are connected to terminals 46, 47 .... The counter electrodes 48, 49 ... which lie opposite the electrodes 44, 45 ... can be connected to each other by a common interconnect 50 which is connected to a terminal 51 with a voltage which is shared by all of the counter electrodes. When used with the diaphragm 4a, the aperture diaphragm 4a' serves the purpose of optical error corrections in the manner that the diaphragm 4a corrects for the diaphragm 4 in the embodiments illustrated in FIGS. 2 and 3.

Figure 6:
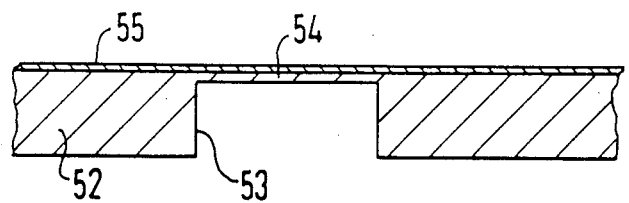
FIGS. 6 through 10 illustrate individual steps in the manufacture of the aperture diaphragms illustrated in FIGS. 2 through 5.
Figure 7:
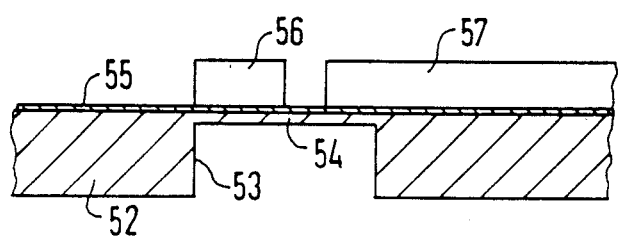

FIG. 6 illustrates a cross-section along a line A-A of FIG. 3 for illustrating the manufacture of an aperture diaphragm according to FIG. 3. The substrate wafer 52 of, for example, silicon is provided with a window 53 so that only a thin membrane 54 remains. For this purpose, the silicon wafer is doped with boron at its surface side and a doping concentration of $1 \times 10^{20}$ atoms/cm$^3$ could be used for this purpose. When etching the window 53, the doped part of the wafer 52 remains as the membrane 54. A metal coat electrode 55 of, for example, chrome is then vapor-deposited over the surface of wafer 52 and a first photoresist layer 56 is then applied to the electrode 55 over the surface. Using a standard photo-lithographic process, the photoresist layer 56 is structured to form parts 56 and 57 which are positioned so that they are outside of the sensing electrodes which are to be applied and this is illustrated in FIG. 7.

Figure 8:
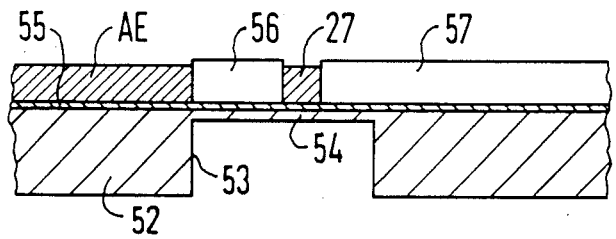
Figure 9:
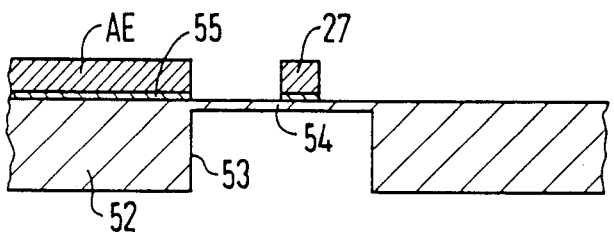

FIG. 8 illustrates the sensing electrodes, for example, AE and 27 which are galvnically constructed at those positions of the metal-coat electrode 55 which are not covered by the photoresist portions 56 and 57. The parts 56 and 57 are subsequently removed and the parts of the metal-coat electrode lying beneath them are removed by ion beam etching to form the structure illustrated in FIG. 9.

Figure 10:
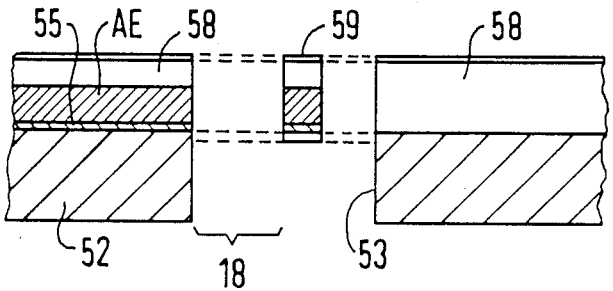

A further photoresist layer 58 is then whirled and structured such that it is retained outside of the desired recess 18 and other areas. Those parts of the silicon membrane not covered by layer 58 are then removed by ion beam etching and a conductive cover layer 59 is applied to the photoresist layer 58 as illustrated in FIG. 10.

According to a modification of the above-described method the formation of the window 53 can be omitted. For this method, an etching process is accomplished after the application of the photoresist layer 58 and the forming thereof and the recess 18 and other recesses are provided by means of this etching process in the semiconductor layer 52 which has not previously been reduced in thickness before the application of the conductive layer 59.

The concept of the invention comprises not only aperture diaphragms for lithography apparatus wherein electron beam probes are employed, but also comprises other particle beam lithography device which, for example, operate with ion beam probes.

Although the invention has been described with respect to preferred embodiments, it is not to be so limited as changes and modifications can be made which are within the full intended scope of the invention as defined by the appended claims.

I claim as my invention:

1. An aperture diaphragm comprising, a line-shaped multi-hole structure and blanking electrodes for generating a plurality of individually blankable particle beam probes for a lithography apparatus comprising, a particle beam source (1), a condensor lens system (2, 3), a blanking diaphragam (5), an imaging optics (6, 7, OL) and a workpiece (9) to be formed, particularly a semiconductor body, characterized in that said aperture diaphgram (4) is composed of a high-resistant substrate, such as silicon or silicon dioxide, on which said blanking electrodes are applied in the form of interconnects (21, 23, AE, 27) which are provided with terminals (24, 26) for the supply of blanking voltages, and characterized in that said multi-hole structure of said aperture diaphragm (4) comprises approximately rectangular or quadratic recesses (14 through 19) which emanate from a center line (20) and are respectively, alternately offset toward one and the other side; and in that electrodes (21, 23) are arranged at the sides of every recess which lie parallel to said center line (20, and said electrodes being positioned for deflecting particle beam probes generated by said recess.

2. An aperture diaphragm according to claim 1, characterized in that the electrodes associated with some or all recesses (14 ... 19) which are arranged in the region of said center line (20) are combined to form a common electrode (27), whereby said electrodes are connected to one another by intermediate webs (35).

3. An aperture diaphragm according to claims 1 or 2, characterized in that said substrate is provided with a conductive coating for the dissipation of the incident particles of the beam probe which is positioned outside of said multi-hole structure on the side facing said particle beam source (1).

4. An aperture diaphragm according to claims 1 comprising a further aperture diaphragm formed with second recesses which are positioned so as to correspond to the recesses of said first aperture diaphragm; and including electrodes (17b, 17c, 44, 48) which are provided at the sides of said second recesses and extend perpendicularly to said center line in the longitudinal direction of said multi-hole structure, and said second electrodes serving for the deflection of the particle beam probes in the longitudinal direction of said multi-hole structure.

5. An aperture diaphragm comprising, a line-shaped multi-hole structure and blanking electrodes for generating a plurality of individually blankable particle beam probes for a lithography apparatus comprising, a particle beam source (1), a condensor lens system (2, 3), a blanking diaphragm (5), an imaging optics (6, 7, OL) and a workpiece (9) to be formed, particularly a semiconductor body, characterized in that said aperture diaphragm (4) is composed of a high-resistant substrate, such as silicon or silicon dioxide, on which said blanking electrodes are applied in the form of interconnects (21, 23, AE, 27) which are provided with terminals (24, 26) for the supply of blanking voltages, characterized in that said multi-hole structure comprises approximately rectangular or quadratic recesses (36, 37) which are arranged along a line and have mutual spacings which correspond with their longitudinal dimensions in the direction of said line; and in that electrodes (3, 39) are arranged at the sides of every recess parallel to said line, and are positioned so as to deflect the particle beam probe generated by said recesses (36, 37), and comprising a further aperture diaphragm formed with second recesses which are positioned so as to correspond to the recesses of said first aperture diaphragm; and including electrodes (17b, 17c, 44, 48) which are provided at the sides of said second recesses and extend perpendicularly to said center line in the longitudinal direction of said multi-hole structure, and said second electrodes serving for the deflection of the particle beam probes in the longitudinal direction of said multi-hole structure.

* * * * *